United States Patent
Liu et al.

(10) Patent No.: US 10,601,252 B2
(45) Date of Patent: Mar. 24, 2020

(54) RESONANT WIRELESS POWER TRANSMITTER CIRCUIT AND CONTROL METHOD THEREOF

(71) Applicant: RICHTEK TECHNOLOGY CORPORATION, Zhubei, HsinChu (TW)

(72) Inventors: Kuo-Chi Liu, Hsinchu (TW); Wei-Hsin Wei, Zhubei (TW); Chia-Hung Tsen, Zhubei (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 468 days.

(21) Appl. No.: 15/587,676

(22) Filed: May 5, 2017

(65) Prior Publication Data
US 2018/0006496 A1    Jan. 4, 2018

(30) Foreign Application Priority Data
Jun. 29, 2016  (TW) .............................. 105120429 A

(51) Int. Cl.
| | |
|---|---|
| H02J 50/12 | (2016.01) |
| H02M 1/00 | (2006.01) |
| H02M 1/38 | (2007.01) |
| H02M 3/337 | (2006.01) |
| H03H 7/38 | (2006.01) |
| H02M 7/521 | (2006.01) |

(52) U.S. Cl.
CPC ............... *H02J 50/12* (2016.02); *H02M 1/38* (2013.01); *H02M 3/3376* (2013.01); *H02M 7/521* (2013.01); *H02M 2001/0003* (2013.01); *H03H 7/38* (2013.01); *Y02B 70/1433* (2013.01)

(58) Field of Classification Search
CPC ....................................................... H02J 50/12
See application file for complete search history.

(56) References Cited

U.S. PATENT DOCUMENTS

| | | | |
|---|---|---|---|
| 2009/0001941 A1* | 1/2009 | Hsu ........................ | H02J 7/0044 323/211 |
| 2011/0127846 A1 | 6/2011 | Urano | |
| 2012/0146424 A1* | 6/2012 | Urano ..................... | H02J 5/005 307/104 |

(Continued)

*Primary Examiner* — Jared Fureman
*Assistant Examiner* — James P Evans
(74) *Attorney, Agent, or Firm* — Tung & Associates

(57) ABSTRACT

The present invention provides a resonant wireless power transmitter circuit, including: a load circuit, a power conversion circuit which is coupled between an input power supply and the load circuit, and a phase detection and control circuit. The power conversion circuit includes plural power switches and a current sensing device. The plural power switches operate with an operating frequency to convert the input power supply to an output power for driving the load circuit, wherein the load circuit has a load current. The load current has a load current phase difference from the switching frequency. The phase detection and control circuit detects a voltage difference between the current inflow terminal and the current outflow terminal of the current sensing device within a dead time in which the plural power switches are not conductive. The voltage difference corresponds to the load current phase difference.

39 Claims, 10 Drawing Sheets

(56) References Cited

U.S. PATENT DOCUMENTS

| | | | |
|---|---|---|---|
| 2012/0161533 A1* | 6/2012 | Urano | H02J 17/00 |
| | | | 307/104 |
| 2012/0223585 A1 | 9/2012 | Urano | |
| 2012/0262004 A1 | 10/2012 | Cook et al. | |
| 2013/0043951 A1* | 2/2013 | Irish | H03F 1/523 |
| | | | 330/285 |
| 2013/0093254 A1* | 4/2013 | Urano | H02J 5/005 |
| | | | 307/104 |
| 2013/0188408 A1* | 7/2013 | Yamamoto | H02M 7/42 |
| | | | 363/140 |
| 2013/0241304 A1* | 9/2013 | Bae | H04B 5/0037 |
| | | | 307/104 |
| 2014/0015340 A1* | 1/2014 | Ito | H02J 5/005 |
| | | | 307/104 |
| 2015/0303703 A1* | 10/2015 | Hayashi | H02J 5/005 |
| | | | 307/104 |
| 2016/0028248 A1* | 1/2016 | Asanuma | H02J 50/90 |
| | | | 307/104 |
| 2017/0149280 A1* | 5/2017 | Buenrostro | H02J 50/10 |
| 2017/0207706 A1* | 7/2017 | Hosotani | H02J 50/80 |
| 2017/0214433 A1* | 7/2017 | Redman-White | H04B 5/0031 |

\* cited by examiner

US 10,601,252 B2

RESONANT WIRELESS POWER TRANSMITTER CIRCUIT AND CONTROL METHOD THEREOF

CROSS REFERENCE

The present invention claims priority to TW 105120429, filed on Jun. 29, 2016.

BACKGROUND OF THE INVENTION

Field of Invention

The present invention relates to a resonant wireless power transmitter circuit; particularly, it relates to a resonant wireless power transmitter circuit with phase detection and control. The present invention also relates to a phase detection and control circuit and a phase detection and control method of the resonant wireless power transmitter circuit.

Description of Related Art

FIG. 1 shows a prior art resonant wireless power transmitter circuit (resonant wireless power transmitter circuit 1) which comprises a DC-DC converter 15, a resonant circuit and an impedance matching circuit. The resonant circuit includes a transmitter coil L. The DC-DC converter-converts an input power VS to an output power VSW, and the resonant circuit and the impedance matching circuit cooperate to convert the output power VSW into a wireless output power by resonance effect; the wireless output power is sent to a wireless field by the transmitter coil L, to achieve wireless power transmission.

The prior art in FIG. 1 has a drawback. Since the operation of the resonant wireless power transmitter circuit 1 is based on resonance effect, if off resonance occurs and is not corrected or properly controlled, it will cause power loss. Off resonance for example may occur under the following conditions: when there is dislocation of the receiver circuit (not shown), or when there are multiple resonant wireless power receiver circuits (not shown) coupled to receive the wireless power at the same time. If off resonance occurs, the current of the reactive components (such as the transmitter coil L and the impedance matching capacitor Cm) in the resonant circuit will lead (have an earlier phase) or lag (have a later phase) with respect to the voltage thereof. That is, there is a phase difference between the current and the voltage of the resonant reactive components and hence the actual power transmitted will be less than expected.

FIG. 2 shows a prior art phase detection circuit (phase detection circuit 150) disclosed in US2012/0223585 A1, wherein the phase detection circuit 150 detects the transmitter current according to a voltage detection circuit and a signal generated by a current transformer 154. The phase detection circuit 150 includes a digital circuit for detecting the phase difference between the voltage and the current of the input signal, to generate a driving frequency for controlling the power transmission control circuit.

The prior art in FIG. 2 has a drawback that the bandwidth of the current transformer 154 is limited for high frequency wireless power applications. Furthermore, its manufacture cost is higher because of the use of a current transformer.

Compared to the prior art in FIG. 1, the present invention has an advantage that the impedance matching is adjustable due to the phase detection function, whereby the present invention has a higher operation efficiency. Compared to the prior art in FIG. 2, the present invention has advantages that fewer components and no transformers are required, and the present invention can operate in applications of higher frequency, such as 6.78 MHz or 13.56 MHz.

SUMMARY OF THE INVENTION

From one perspective, the present invention provides a resonant wireless power transmitter circuit, comprising: a load circuit; a power conversion circuit which is coupled between an input power supply and the load circuit, wherein the power conversion circuit is a half-bridge or a full bridge power conversion circuit, and includes plural power switches and a current sensing device, wherein the plural power switches are configured to operably switch with an operating frequency to convert the input power supply to an output power for driving the load circuit such that the load circuit has a load current, wherein there is a load current phase difference between the load current and the operating frequency; and a phase detection and control circuit, configured to operably detect a voltage difference between a current inflow terminal and a current outflow terminal of the current sensing device within a dead time period in which each of the plurality of power switches are OFF, wherein the voltage difference corresponds to the load current phase difference.

In one embodiment, the input power supply is connected between a positive input node and a ground node, and the output power is coupled between a positive output node and a negative output node; wherein (A) when the power conversion circuit is a half-bridge power conversion circuit, the plurality of power switches include a first power switch and a second power switch, wherein each of the first power switch and second power switch has a current inflow terminal and a current outflow terminal, the current outflow terminal of the first power switch and the current inflow terminal of the second power switch being connected to the positive output node, the current outflow terminal of the second power switch being connected to the negative output node, the current inflow terminal of the first power switch being connected to the positive input node, and the negative output node being connected to the ground node; or (B) when the power conversion circuit is a full-bridge power conversion circuit, the plurality of power switches include a first power switch, a second power switch, a third power switch and a fourth power switch, wherein each of the first power switch, the second power switch, the third power switch and the fourth power switch has a current inflow terminal and a current outflow terminal, the current outflow terminal of the first power switch and the current inflow terminal of the second power switch being connected to the positive output node, the current outflow terminal of the third power switch and the current inflow terminal of the fourth power switch being connected to the negative output node, the current inflow terminal of the first power switch and the current inflow terminal of the third power switch being connected to the positive input node, and the current outflow terminal of the second power switch and the current outflow terminal of the fourth power switch being connected to the ground node; wherein the current sensing device is one of the plurality of power switches, and the voltage difference between the current inflow terminal and the current outflow terminal of the current sensing device is a voltage difference between the current inflow terminal and the current outflow terminal of this power switch.

In one embodiment, the phase detection and control circuit detects the voltage difference within a time period which starts from a time point when the current sensing device is turned from ON to OFF and ends at a time point when one of the plural power switches are turned from OFF to ON.

In one embodiment, the load circuit is a resonant circuit which includes: a transmitter circuit, including at least a transmitter coil; and an impedance matching circuit which is coupled to the transmitter circuit; wherein the transmitter circuit and the impedance matching circuit convert the load current into a wireless output power through resonant effect, wherein the transmitter coil transmits the wireless output power to a wireless field for wireless power transmission; wherein the impedance matching circuit includes: one or more capacitors, and/or one or more varactors, and/or one or more switch-control capacitor circuits; wherein each of the one or more switch-control capacitor circuits includes at least one capacitor and at least one capacitor control switch connected to each other, wherein a reactance of the switch-control capacitor circuit is controlled by turning ON or OFF the at least one capacitor control switch.

In one embodiment, the phase detection and control circuit further generates an impedance control signal according to the voltage difference to control the impedance matching circuit for adjusting the impedance of the impedance matching circuit such that the load current phase difference is regulated at a pre-determined phase difference level.

In one embodiment, the resonant circuit includes a resonant input impedance, and the phase detection and control circuit regulates the load current phase difference such that the resonant input impedance is matched.

In one embodiment, the phase detection and control circuit includes: a phase difference determining circuit which includes a comparison circuit and a detection timing circuit, wherein the comparison circuit compares the voltage difference and a reference voltage to generate a comparison result, and the detection timing circuit selectively latches the comparison result to generate a phase difference determining signal according to a pre-determined detection timing point, wherein the pre-determined detection timing point is a pre-determined time point within the dead time period; and a signal conversion circuit, including a logic circuit which generates the impedance control signal according to the phase difference determining signal and a time length signal.

In one embodiment, the phase detection and control circuit generates the reference voltage according to a phase setting signal to regulate the load current phase difference at the pre-determined phase difference level.

In one embodiment, the phase detection and control circuit further generates a frequency control signal according to the voltage difference to control the operating frequency such that the load current phase difference is regulated at a pre-determined phase difference level.

In one embodiment, the duty ratio of each of the plural power switches are substantially close to and lower than 50 time %.

From another perspective, the present invention provides a phase detection and control circuit, configured to operably control a resonant wireless power transmitter circuit which comprises: a load circuit; and a power conversion circuit which is coupled between an input power supply and the load circuit, wherein the power conversion circuit is a half-bridge or a full bridge power conversion circuit, and includes plural power switches and a current sensing device, wherein the plural power switches are configured to operably switch with an operating frequency to convert the input power supply to an output power for driving the load circuit such that the load circuit has a load current, wherein there is a load current phase difference between the load current and the operating frequency; wherein the phase detection and control circuit detects a voltage difference between the current inflow terminal and the current outflow terminal of the current sensing device within a dead time period in which each of the plurality of power switches are OFF, wherein the voltage difference corresponds to the load current phase difference; the phase detection and control circuit including: a phase difference determining circuit which includes a comparison circuit and a detection timing circuit, wherein the comparison circuit compares the voltage difference and a reference voltage to generate a comparison result, and the detection timing circuit selectively latches the comparison result to generate a phase difference determining signal according to a pre-determined detection timing point, wherein the pre-determined detection timing point is a pre-determined time point within the dead time period; and a signal conversion circuit, including a logic circuit which generates the impedance control signal according to the phase difference determining signal and a time length signal.

From another perspective, the present invention provides a driving circuit, configured to operably drive a resonant wireless power transmitter circuit which comprises a load circuit; the driving circuit includes: a power conversion circuit which is coupled between an input power supply and the load circuit, wherein the power conversion circuit is a half-bridge or a full bridge power conversion circuit, and includes plural power switches and a current sensing device, wherein the plural power switches are configured to operably switch with an operating frequency to convert the input power supply to an output power for driving the load circuit such that the load circuit has a load current, wherein there is a load current phase difference between the load current and the operating frequency; and a phase detection and control circuit, configured to operably detect a voltage difference between the current inflow terminal and the current outflow terminal of the current sensing device within a dead time period in which each of the plurality of power switches are OFF, wherein the voltage difference corresponds to the load current phase difference.

From another perspective, the present invention provides a method for controlling a resonant wireless power transmitter circuit which comprises: a load circuit; and a power conversion circuit which is coupled between an input power supply and the load circuit, wherein the power conversion circuit is a half-bridge or a full bridge power conversion circuit, and includes plural power switches and a current sensing device, wherein the plural power switches are configured to operably switch with an operating frequency to convert the input power supply to an output power for driving the load circuit such that the load circuit has a load current, wherein there is a load current phase difference between the load current and the operating frequency; the control method includes: determining a dead time period in which each of the plural power switches are OFF; and detecting a voltage difference between the current inflow terminal and the current outflow terminal of the current sensing device within the dead time period, wherein the voltage difference corresponds to the load current phase difference.

In one embodiment, the method further includes: generating an impedance control signal according to the voltage difference to control the impedance matching circuit for adjusting the impedance of the impedance matching circuit such that the load current phase difference is regulated at a pre-determined phase difference level.

In one embodiment, the resonant circuit includes a resonant input impedance, and the method further includes: regulating the load current phase difference such that the resonant input impedance is matched.

In one embodiment, the step of generating the impedance control signal includes: comparing the voltage difference and a reference voltage to generate a comparison result; selectively latching the comparison result to generate a phase difference determining signal according to a pre-determined detection timing point, wherein the pre-determined detection timing point is a pre-determined time point within the dead time period; and generating the impedance control signal according to the phase difference determining signal and a time length signal.

In one embodiment, the step of generating the impedance control signal further includes: generating the reference voltage according to a phase setting signal to regulate the load current phase difference at the pre-determined phase difference level.

In one embodiment, the method further includes: generating a frequency control signal according to the voltage difference to control the operating frequency such that the load current phase difference is regulated at a pre-determined phase difference level.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1:
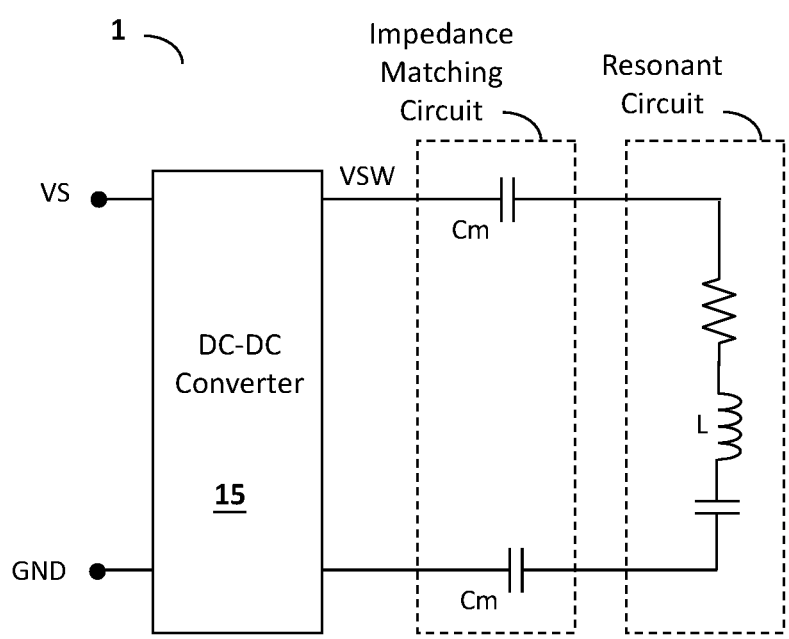
FIG. 1 shows a schematic diagram of a prior art resonant wireless power transmitter circuit.
Figure 2:
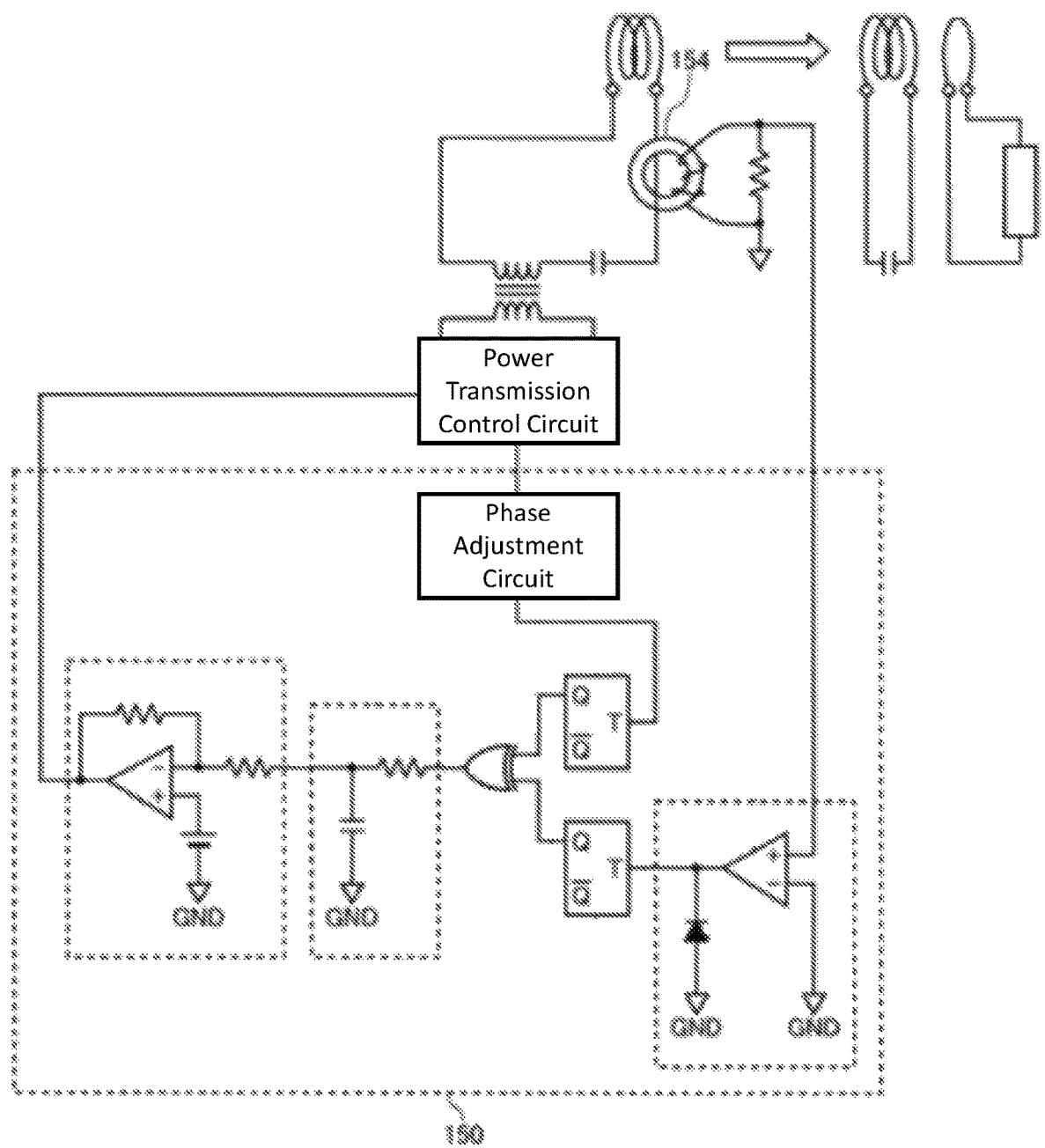
FIG. 2 shows a schematic diagram of a prior art resonant wireless power transmitter circuit.
Figure 3A:
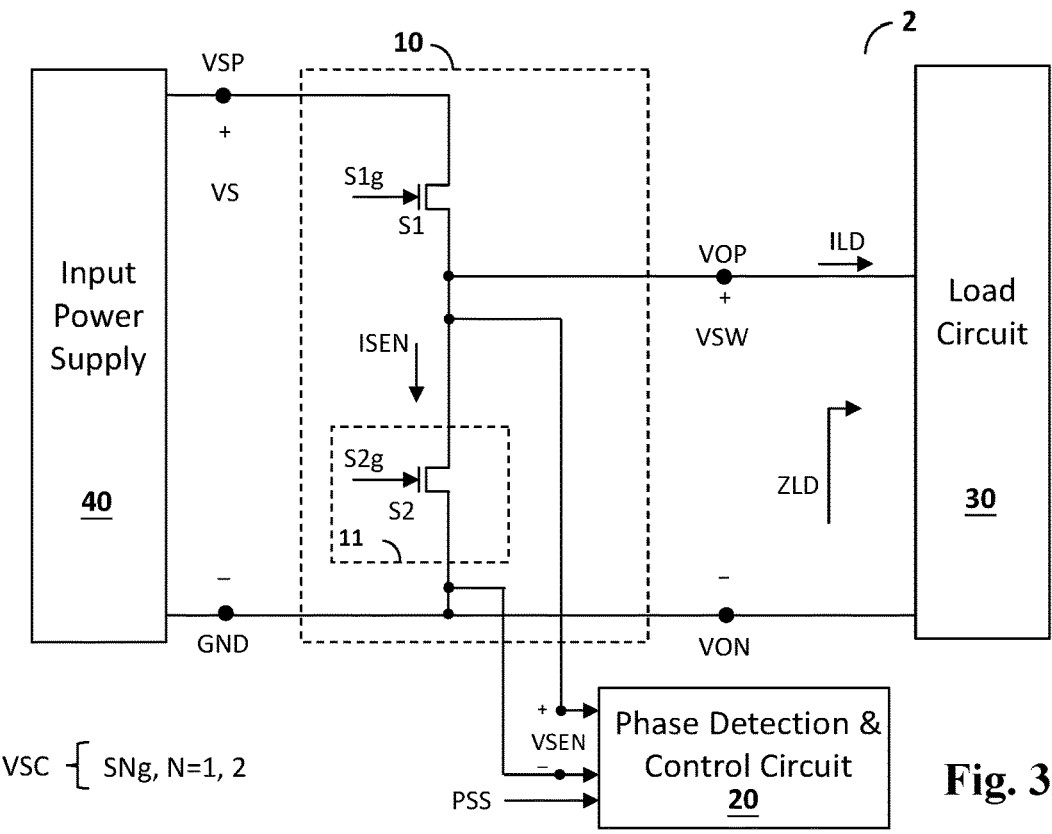
FIG. 3A shows a block diagram of an embodiment of the resonant wireless power transmitter circuit with phase detection and control function according to the present invention.

FIG. 3A shows one embodiment of the resonant wireless power transmitter circuit according to the present invention (resonant wireless power transmitter circuit 2), wherein the resonant wireless power transmitter circuit 2 includes a power conversion circuit 10, a load circuit 30 and a phase detection and control circuit 20. The power conversion circuit 10 includes plural power switches, wherein the plural power switches operate according to a switch control signal VSC to convert an input power supply 40 to an output power VSW between a positive output node VOP and a negative output node VON to drive the load circuit 30. The switch control signal VSC has an operating frequency and a switching phase, and the plural power switches operate (switch ON/OFF) for example according to the operating frequency.

The load circuit 30 includes a load impedance ZLD and has a load current ILD when driven by the output power VSW, wherein the load current ILD has a load current phase, and there is a phase difference (referred to as a "load current phase difference PDLD") between the switching phase (frequency phase) and the load current phase.

When the load impedance ZLD is matched (i.e. the coefficient of the imaginary part of the load impedance ZLD is zero), the load current phase is in phase with the switching phase, that is, the load current phase difference PDLD is zero. And when the load impedance ZLD is not matched (i.e. the coefficient of the imaginary part of the load impedance ZLD is non-zero), the load current phase is not in phase with the switching phase, that is, the load current phase difference PDLD is not zero, which may be leading or lagging.

In one embodiment, the power conversion circuit 10 is a half-bridge power conversion circuit as shown in FIG. 3A. In this embodiment, the plural power switches includes power switches S1 and S2. Each of the power switches S1 and S2 has a current inflow terminal and a current outflow terminal, wherein the current outflow terminal of the power switch S1 and the current inflow terminal of the power switch S2 are connected to the positive output node VOP; the current outflow terminal of the power switch S2 is connected to the negative output node VON; the current inflow terminal of the power switch S1 is connected to the positive input node VSP which is coupled to the input power supply 40; and, in this embodiment, the negative output node VON is connected to the ground node which is coupled to the input power supply 40.

The switching phases of the power switches S1 and S2 are opposite to each other. In one embodiment, the duty ratio of each of the power switches S1 and S2 is substantially close to and lower than 50 time %. More specifically, although ideally the duty ratios of both the power switches S1 and S2 should be exactly 50 time %, to avoid shoot-through wherein the power switches S1 and S2 are ON at the same time to cause a short-circuit, it is preferred that there is a dead time period, in which both the power switches S1 and S2 are OFF, between when one of the power switches S1 and S2 is turned OFF and when the other of the power switches S1 and S2 is turned ON. The dead time period ensures that there will not be shoot-through. The dead time period is for example but not limited to low than 5 time % of a complete cycle period. Because of the existence of the dead time period, the duty ratios of the power switches S1 and S2 are substantially close to 50 time %, but not exactly equal to 50 time %.

In the power conversion circuit 10, one of the plural power switches (for example but not limited to the power switch S2 shown in the figure; in one embodiment, S2 may be a MOSFET switch) also acts as a current sensing device 11; the current inflow terminal, the current outflow terminal and the control terminal of the current sensing device 11 correspond to the current inflow terminal, the current outflow terminal and the control terminal of corresponding power switch (i.e. S2), respectively. A sensing current ISEN flows through the current sensing device 11 and a voltage difference VSEN is generated, wherein the sensing current ISEN corresponds to a conduction current of the corresponding power switch (the drain-source current of S2 in this embodiment) and the voltage difference VSEN corresponds to a voltage difference between the current inflow terminal and the current outflow terminal of the corresponding power switch (the drain-source voltage difference of S2 in this embodiment).

A phase detection and control circuit 20 is coupled between the current inflow terminal and the current outflow terminal of the current sensing device 11. The phase detection and control circuit 20 determines a detection timing point TM within the aforementioned dead time period in which each of the power switches S1 and S2 are OFF, and detects the level of the voltage difference VSEN at the detection timing point TM to determine the load current phase difference PDLD. Referring to FIG. 4B, in one embodiment, the phase difference detection timing point TM is preferably within the dead time period TDD, wherein the dead time period TDD is a time period which starts from a time point when the current sensing device 11 is turned from ON to OFF and ends at a time point when one of the plural power switches are turned from OFF to ON, and all the plural switches are OFF within the dead time period TDD.

Figure 3B:
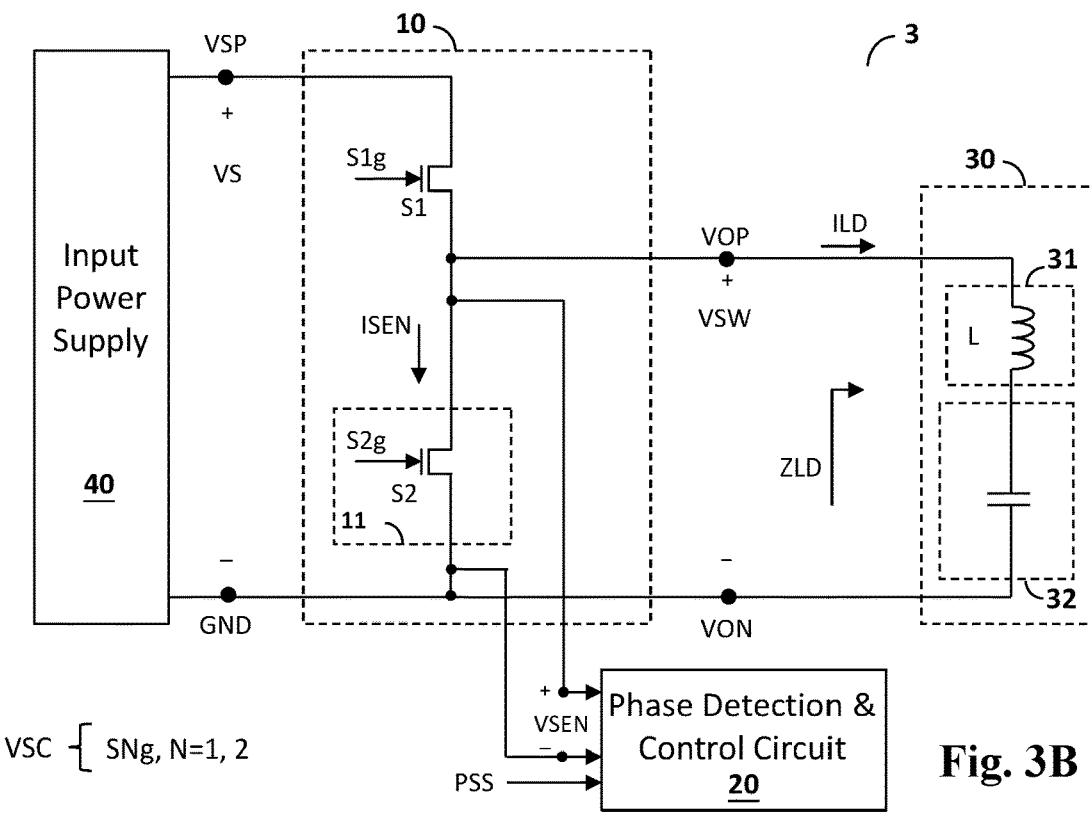
FIG. 3B shows a schematic diagram of a specific embodiment of the resonant wireless power transmitter circuit with phase detection and control function according to the present invention.

FIG. 3B shows a schematic diagram of a specific embodiment of the load circuit (load circuit 30') of the resonant wireless power transmitter circuit according to the present invention. In this embodiment, the load circuit 30' is a resonant circuit which includes a transmitter circuit and an impedance matching circuit 32, wherein the transmitter circuit 31 includes at least a transmitter coil L. The transmitter circuit 31 and the impedance matching circuit 32 are coupled to each other. the transmitter circuit 31 and the impedance matching circuit 32 convert the output power VSW into a resonant current which corresponds to the aforementioned load current ILD through resonant effect, and convert the load current ILD into a wireless output power, wherein the transmitter coil L transmits the wireless output power to a wireless field to achieve wireless power transmission. Referring to FIG. 3B, the switch control signals VS1g and VS2g correspond to the aforementioned switch control signal VSC, which control the power switches S1 and S2 respectively. The load impedance ZLD of the load circuit 30' varies according to different combinations of the inductance of the transmitter coil L and the impedance of the impedance matching circuit. The resonant current has a resonant current phase difference which corresponds to the aforementioned load current phase difference PDLD.

Figure 4A:
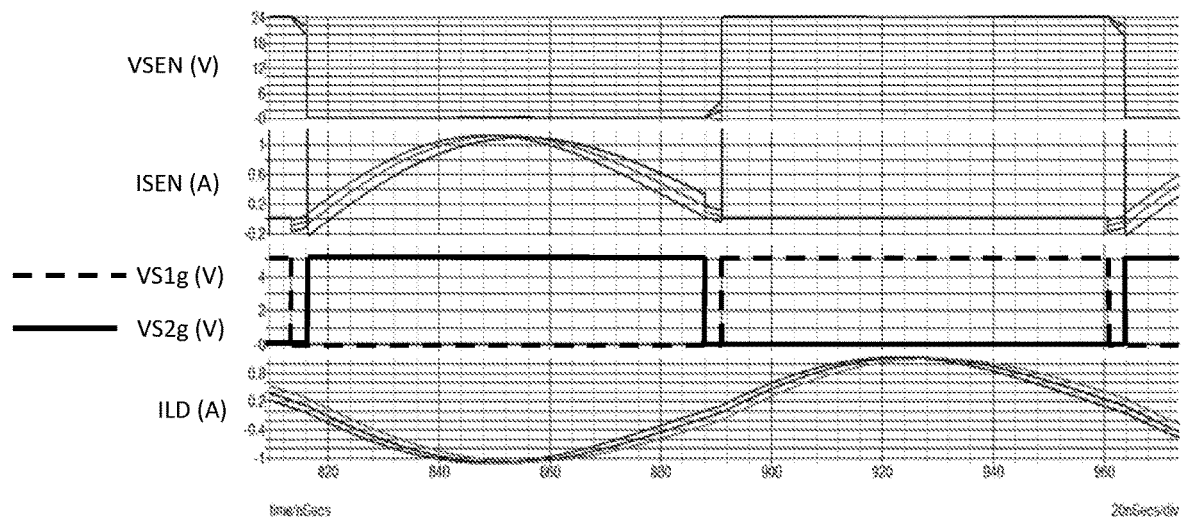
FIG. 4A shows simulation waveforms corresponding to the resonant wireless power transmitter circuit shown in FIG. 3B.
Figure 4B:
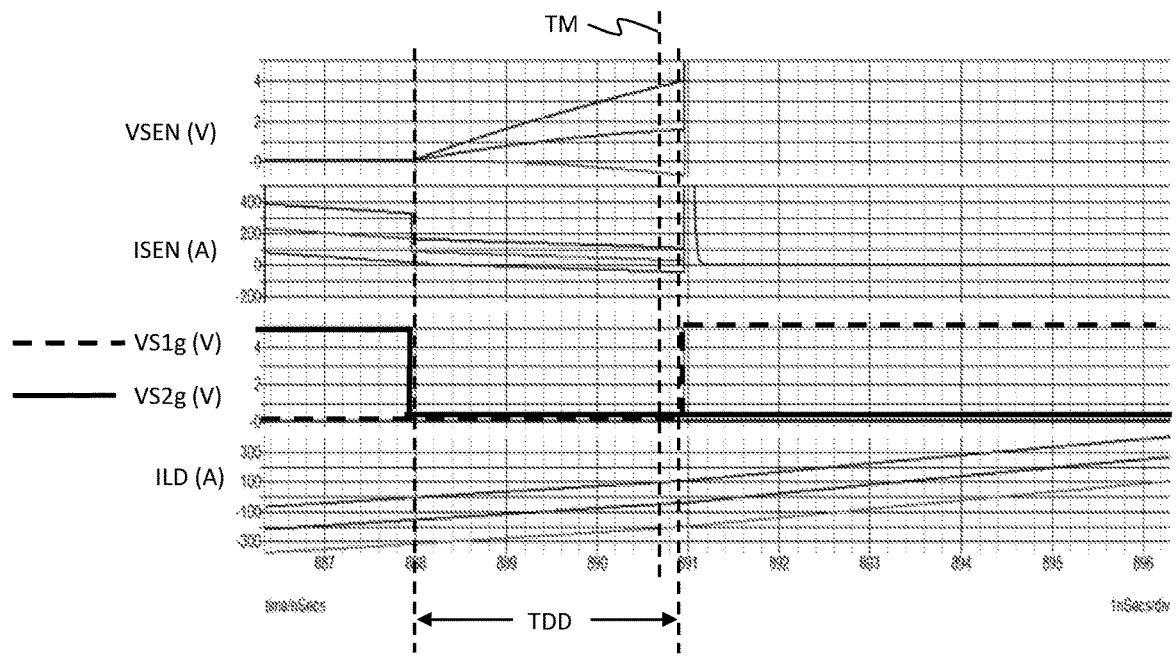
FIG. 4B shows zoomed-in simulation waveforms corresponding to FIG. 4A.

FIGS. 4A and 4B show simulation waveforms corresponding to the resonant wireless power transmitter circuit shown in FIG. 3B, wherein the voltage level of the input power supply 40 is 24V, and the operating frequency FP of the power conversion circuit 10 is 6.78 MHz. Waveforms VS1g and VS2g show the gate control voltage of the power switch S1 and the gate control voltage of the power switch S2; in this embodiment, the power switch S2 is the current sensing device 11, so the gate control voltage of the power switch S2 corresponds to the voltage on the control terminal of the current sensing device 11. In this embodiment, when VS1g and VS2g are at high level, the power switches S1 and S2 are ON, and when VS1g and VS2g are at low level, the power switches S1 and S2 are OFF. The duty ratios of the power switches S1 and S2 are close to and lower than 50 time %, and are conductive respectively at the positive half cycle and the negative half cycle of the load current ILD. As shown in the figures, during a half cycle of the operating frequency FP, the sensing current ISEN through the current sensing device 11 (S2) is a sinusoidal wave having a phase which is opposite to the load current ILD. The figures show simulation results with three different load impedances ZLD, which are, ZLD=25 ohm, 25+j4 ohm and 25−j4 ohm. Correspondingly, there are three waveforms of the load current ILD, with three different load current phase differences PDLD corresponding to cases of matching, lagging and leading. There are also three waveforms of the sensing current ISEN corresponding to the aforementioned three different load impedances ZLD.

During the aforementioned dead time period TDD, if the load impedance ZLD is matched, the load current phase difference is substantially zero, and the load current ILD is also substantially zero. On the other hand, during the dead time period TDD, if the load impedance ZLD is not matched, the load current phase difference is not zero, and the load current ILD is also not zero. Because the plural power switches are all OFF during the dead time period TDD, the non-zero current ILD will charge the parasitic capacitor of the current sensing device 11, and cause the voltage difference VSEN of the current sensing device 11 to change during the detecting dead time period TDD, as shown in the figure. Note that the change of the voltage difference VSEN is related to the load current phase difference PDLD, and therefore, the load current phase difference PDLD may be detected by measuring the voltage difference VSEN.

FIG. 4B shows zoomed-in simulation waveforms corresponding to FIG. 4A during the dead time period TDD. In this embodiment, as shown in the figure, the more the load current phase difference PDLD lags, the higher the voltage difference VSEN rises during the dead time period TDD. Hence, the phase detection and control circuit 20 may detect the level of the voltage difference VSEN at a detection timing point (for example but not limited to the detection timing point TM as shown in the figure) within the dead time period TDD, to determine the load current phase difference PDLD. The detection timing point TM is preferably shortly before the end of the dead time period TDD (for example but not limited to a time point right before the rising edge of the switch control signal VS1g of the power switch S1 in this embodiment). At this moment, the voltage difference VSEN has a higher voltage level and hence a higher noise-resisting capability during detection.

Figure 5:
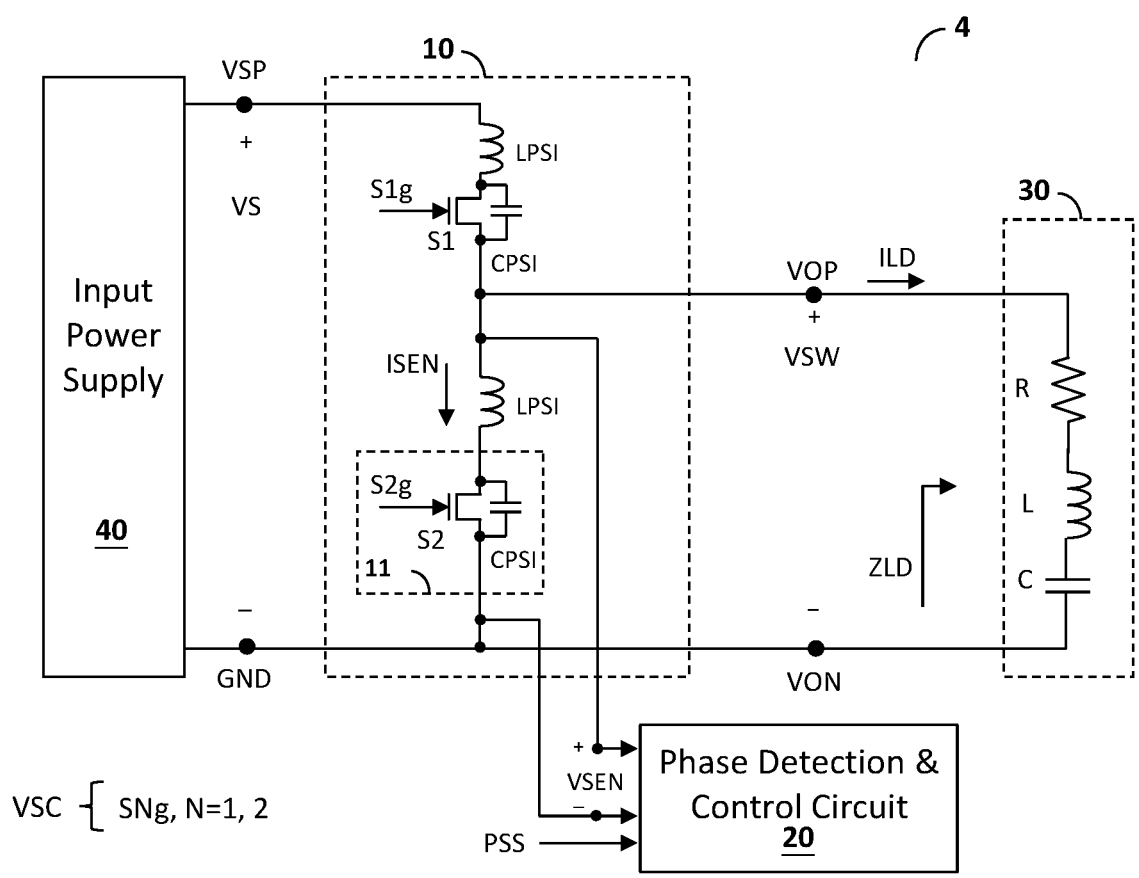
FIG. 5 shows a schematic diagram of a specific embodiment of the resonant wireless power transmitter circuit with phase detection and control function according to the present invention.

FIG. 5 shows a schematic diagram of a specific embodiment of the resonant wireless power transmitter circuit (resonant wireless power transmitter circuit 4) according to the present invention. In this embodiment, the current sensing device 11 (corresponding to the power switch S2) is an N channel MOSFET (N-MOSFET). CPSI is the parasitic capacitance between the current inflow terminal and the current outflow terminal of the current sensing device 11. LPSI is the parasitic inductance of the wire bonding and the circuit board. And the load circuit 30 in this embodiment includes the equivalent inductance, the equivalent resistance and the equivalent capacitance of the resonant circuit.

Figure 6A:
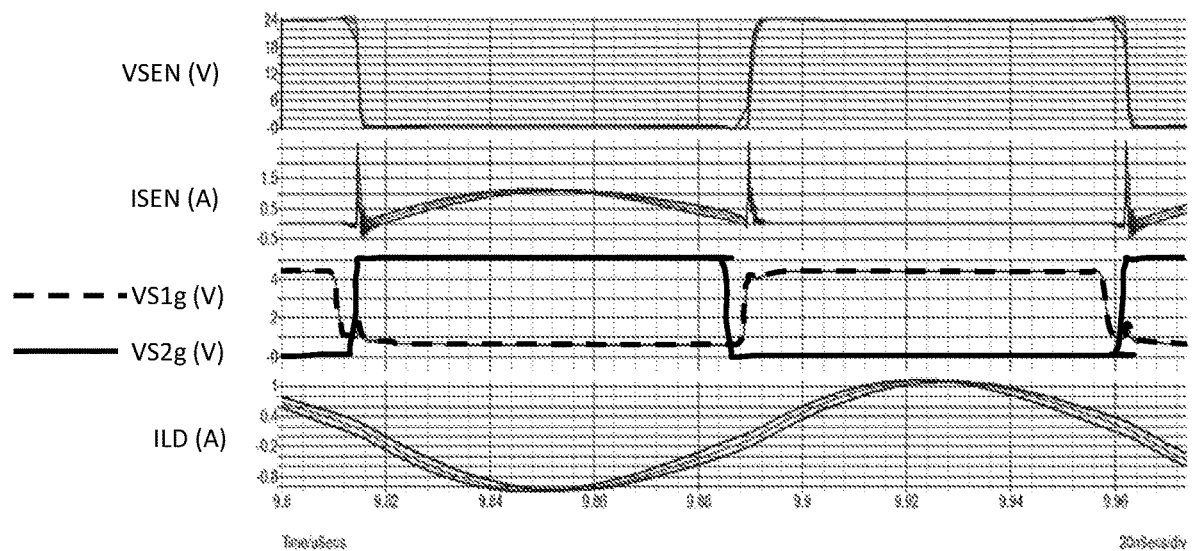
FIG. 6A shows simulation waveforms corresponding to the resonant wireless power transmitter circuit shown in FIG. 5.
Figure 6B:
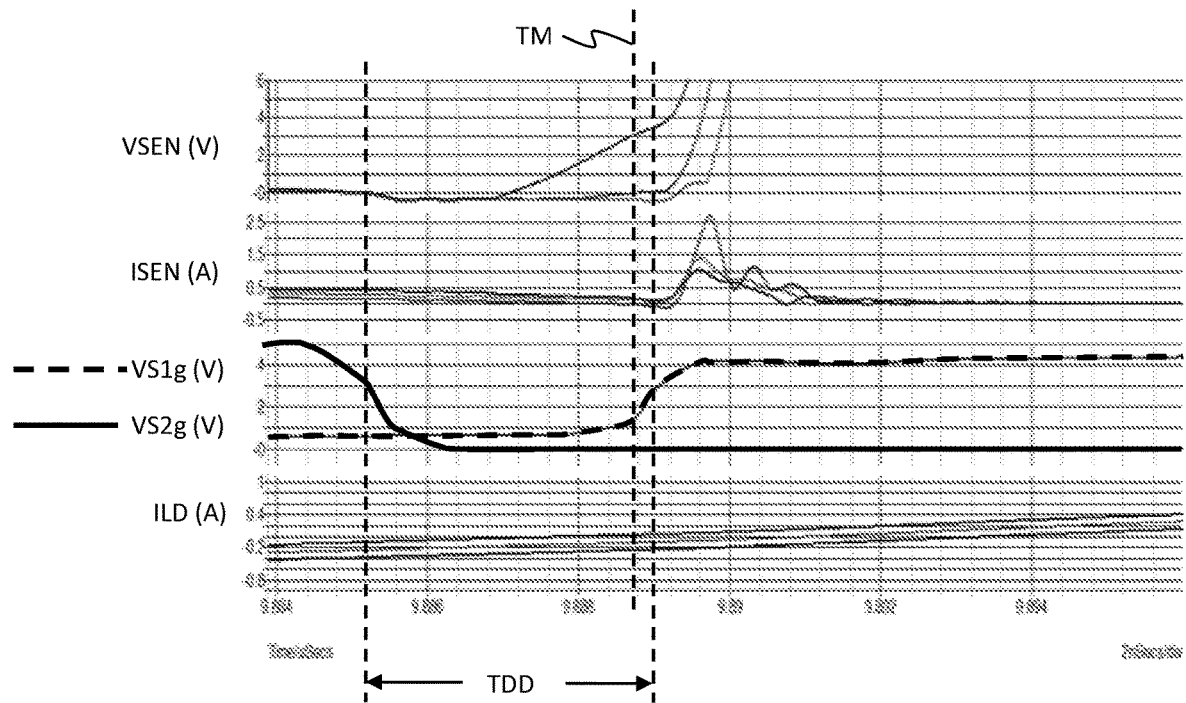
FIG. 6B shows zoomed-in simulation waveforms corresponding to FIG. 6A.

FIGS. 6A and 6B show simulation waveforms corresponding to the resonant wireless power transmitter circuit 4 shown in FIG. 5. Similar to the embodiment shown in FIGS. 4A and 4B, the simulation in this embodiment is also achieved with three different load impedances ZLD, which are, ZLD=25 ohm, 25+j4 ohm and 25−j4 ohm, and similar results are generated with similar relationships among the signals. However, this embodiment is different from the previous embodiment in that parasitic circuits such as the parasitic capacitance CPSI and parasitic inductance LPSI are added in the simulation, so the sensing current ISEN has a ringing waveform when the current sensing device 11 is switching (for example after the dead time period TDD ends, as shown in the figure). Note that even under such circumstance, the present invention can still effectively determine the load current phase difference PDLD by detecting the level of the voltage difference VSEN within the dead time period TDD. As shown in FIG. 6A, even though the ringing of the sensing current ISEN is large, the level and the shape of the voltage difference VSEN is not much affected, and the load current phase difference PDLD still can be effective determined according to the voltage difference VSEN.

FIG. 6B shows zoomed-in simulation waveforms corresponding to FIG. 6A during the dead time period TDD. In this embodiment, as shown in the figure, the more the load current phase difference PDLD lags, the higher the voltage difference VSEN rises during the dead time period TDD. Hence, the phase detection and control circuit 20 may detect the level of the voltage difference VSEN at a detection timing point (for example but not limited to the detection timing point TM as shown in the figure) within the detecting dead time period TDD, to determine the load current phase difference PDLD. The detection timing point TM is preferably shortly before the end of the detecting dead time period TDD (for example but not limited to a time point right before the rising edge of the switch control signal VS1g of the power switch S1 in this embodiment). At this moment, the voltage difference VSEN has a higher voltage level and hence a higher noise-resisting capability during detection. Note that the level and the shape of the voltage difference VSEN is not much affected by the ringing of the sensing current ISEN.

Figure 7:
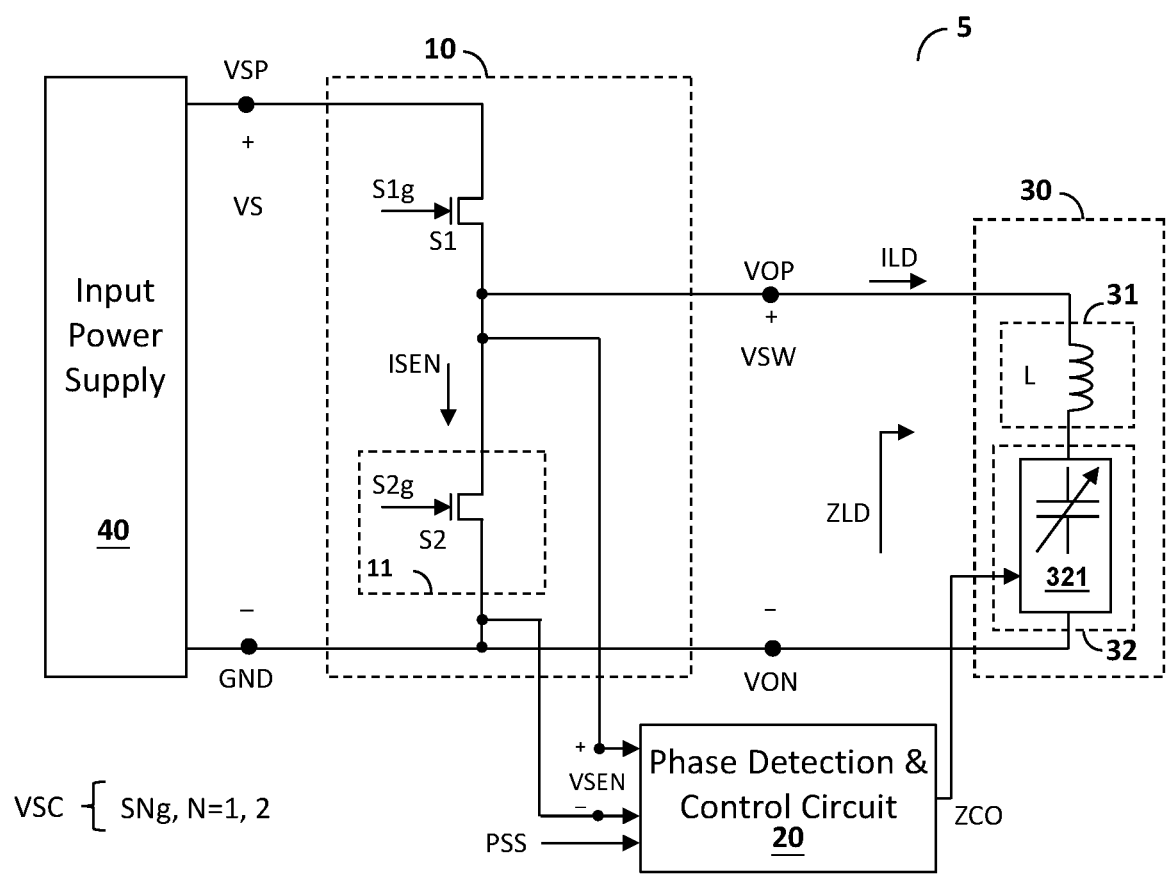
FIG. 7 shows a schematic diagram of a specific embodiment of the resonant wireless power transmitter circuit with phase detection and control function according to the present invention.

FIG. 7 shows a schematic diagram of a specific embodiment of the resonant wireless power transmitter circuit (resonant wireless power transmitter circuit 5) according to the present invention. In this embodiment, the impedance matching circuit 32 includes at least a variable capacitor circuit 321 which includes at least one varactor, or at least one switch-control capacitor circuit, or a combination thereof such that the reactance of the variable capacitor circuit 32 is adjustable. The switch-control capacitor circuit includes at least one capacitor and at least one corresponding capacitor control switch connected to each other. The impedance of the variable capacitor circuit 321 may be adjusted by controlling the capacitor control switch, or by controlling a control signal of the varactor (for example by controlling a control voltage of a voltage-controlled varactor).

Referring to FIG. 7, the phase detection and control circuit 20 further generates an impedance control signal ZCO according to the load current phase difference PDLD which is determined by detecting the level of the voltage difference VSEN, and the impedance control signal ZCO controls the aforementioned varactor or capacitor control switch of the variable capacitor circuit 321 to regulate the load impedance ZLD, such that the load current phase difference PDLD is regulated at a pre-determined phase difference. The "pre-determined" phase difference may be a fixed value or an adjustable variable. In one embodiment, the pre-determined phase difference preferably is zero such that the resonant input impedance of the resonant wireless power transmitter circuit 5 is matched, that is, the imaginary part of the load impedance ZLD is substantially zero. It should be explained that, although the target is to make the imaginary part of the load impedance ZLD zero through regulation by a feedback loop including the phase detection and control circuit 20, however, due to non-ideal factors of circuits, the imaginary part of the regulated load impedance ZLD may not be exactly zero, so "substantially zero" is not required to be perfectly and exactly zero.

Figure 11:
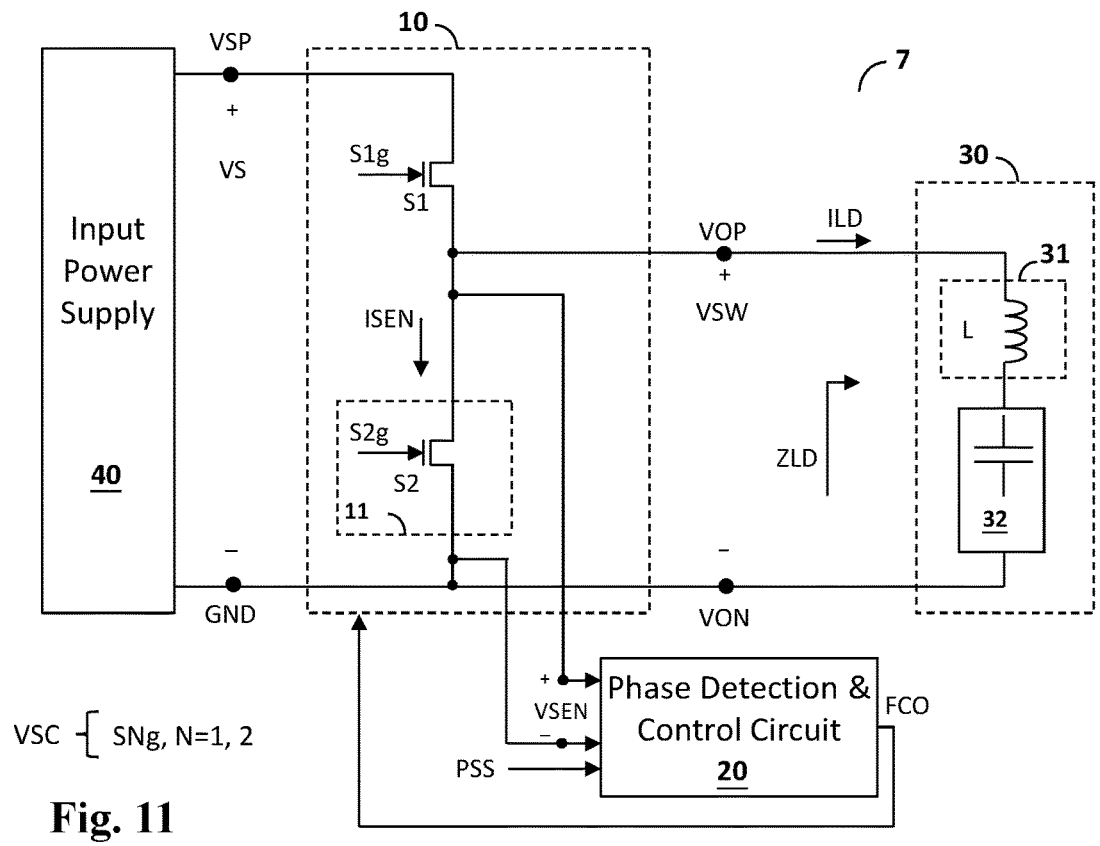
FIG. 11 shows a schematic diagram of a specific embodiment of the phase detection and control circuit of the resonant wireless power transmitter circuit according to the present invention.

Referring to FIG. 11, in one embodiment, the phase detection and control circuit 20 further generates a frequency control signal FCO according to the load current phase difference PDLD which is determined by detecting the level of the voltage difference VSEN. The frequency control signal FCO controls the aforementioned operating frequency FP of the plural power switches (the power switches S1 and S2 of the power conversion circuit 10 in FIG. 11 and in the aforementioned embodiments), such that the load current phase difference PDLD is regulated at a pre-determined phase difference.

Figure 8:
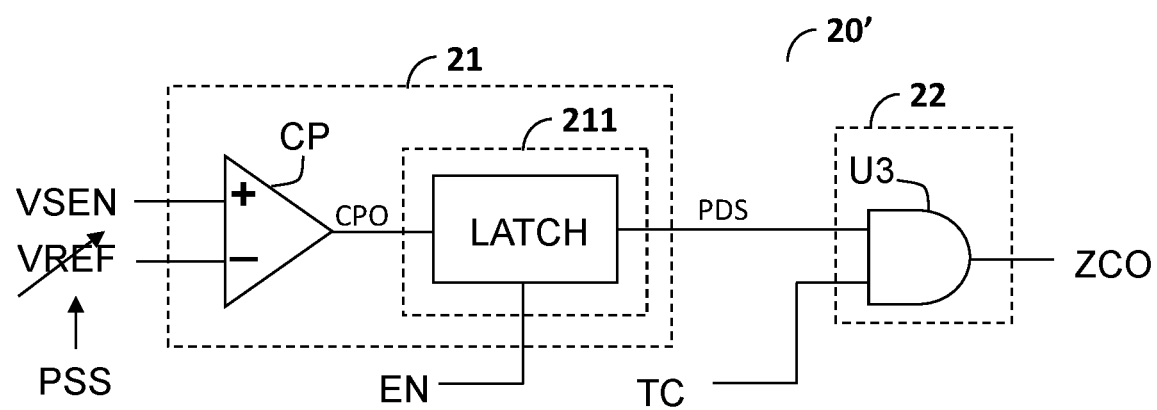
FIG. 8 shows a schematic diagram of a specific embodiment of the phase detection and control circuit of the resonant wireless power transmitter circuit according to the present invention.

FIG. 8 shows a schematic diagram of a specific embodiment of the phase detection and control circuit (phase detection and control circuit 20'), which can be used as the phase detection and control circuit 20 in FIG. 7 and in other aforementioned embodiments, of the resonant wireless power transmitter circuit according to the present invention. The phase detection and control circuit 20' includes a phase difference determining circuit 21 and a signal conversion circuit 22. The phase difference determining circuit 21 includes a comparison circuit CP and a detection timing circuit 211, wherein the comparison circuit CP compares the voltage difference VSEN and a reference voltage VREF to generate a comparison result CPO, and the detection timing circuit 211 selectively latches the comparison result CPO to generate a phase difference determining signal according to a pre-determined detection timing point (e.g., TM in FIGS. 4B and 6B), wherein the phase difference determining signal corresponds to the load current phase difference PDLD. The signal conversion circuit generates the impedance control signal ZCO according to the phase difference determining signal, for controlling the impedance of the impedance matching circuit 32 such that the load current phase difference PDLD is regulated at a pre-determined phase difference.

In one embodiment as shown in FIG. 8, the detection timing circuit 211 may include a latch circuit LATCH, controlled by an enable signal EN. The enable signal EN determines the detection timing point (e.g., TM) such that the detection timing circuit 211 can determine the phase difference determining signal PDS at the detection timing point TM. In one embodiment as shown in FIG. 8, the signal conversion circuit 22 may include a logic circuit U3 (which may be for example but not limited to an AND gate as shown in the figure) which converts the phase difference determining signal into the impedance control signal ZCO according to a time length control signal TC; the impedance control signal ZCO controls the impedance of the impedance matching circuit 32, such that the load current phase difference PDLD is regulated at a pre-determined phase difference.

Note that in this embodiment, the pre-determined phase difference is also related to the level of the reference voltage VREF. Hence, in one embodiment, the level of the pre-determined phase difference may be adjusted to a preferred phase difference level by setting the level of the reference voltage VREF, that is, the load current phase difference PDLD may be regulated at a pre-determined phase difference by adjusting the level of the reference voltage VREF. The level of the reference voltage VREF, if adjustable, may be set for example according to a phase setting signal PSS.

Figure 9:
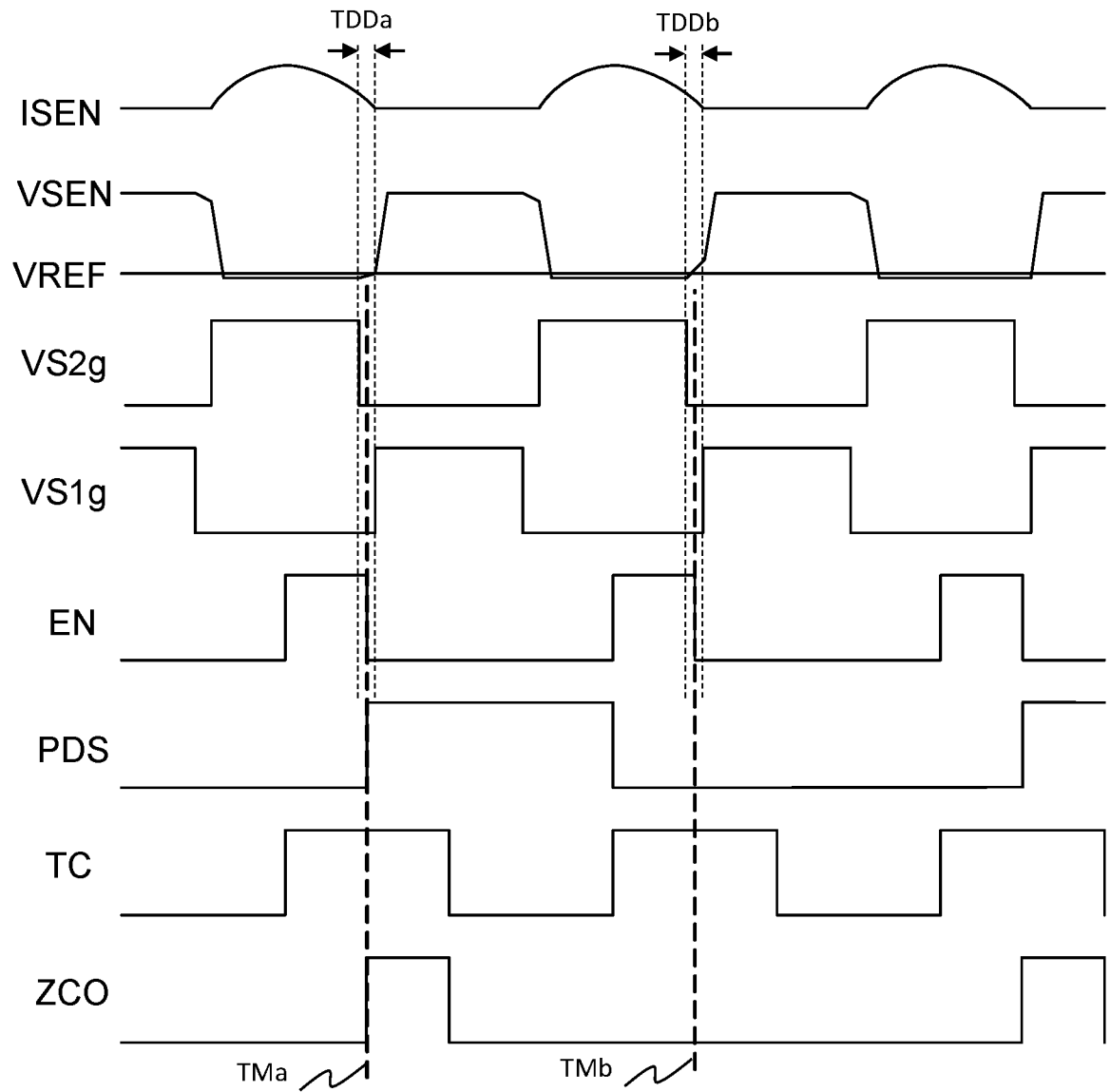
FIG. 9 shows simulation waveforms corresponding to the phase detection and control circuit shown in FIG. 8.

FIG. 9 shows simulation waveforms corresponding to the phase detection and control circuit 20' of the resonant wireless power transmitter circuit shown in FIG. 8, wherein the waveforms VS1g and VS2g show the gate control voltage of the power switch S1 and the gate control voltage of the power switch S2; in this embodiment, the power switch S2 is the current sensing device 11, so the gate control voltage of the power switch S2 corresponds to the voltage on the control terminal of the current sensing device 11. In this embodiment, when VS1g and VS2g are at high level, the power switches S1 and S2 are ON, and when VS1g and VS2g are at low level, the power switches S1 and S2 are OFF. The falling edge of the enable signal EN corresponds to the aforementioned detection timing point TM (e.g., TMa and TMb in FIG. 9), which is a pre-determined detection timing point within a dead time period (e.g., TDDa and TDDb in FIG. 9) immediately after a time point when the current sensing device 11 is turned from ON to OFF (e.g., the falling edge of VS2g in FIG. 9). In this embodiment, the phase difference determining circuit 21 samples and latches (i.e., selectively latches) the comparison result CPO which is generated by comparing the voltage difference VSEN and the reference voltage VREF, to generate the phase difference determining signal PDS. The phase difference determining signal PDS is reset when the enable signal EN is at high level again (as shown in the figure, when the enable signal EN is at high level, the phase difference determining signal PDS is reset to low level).

Referring to FIG. 9, at the detection timing point TMa, the reference voltage VREF is higher than the voltage difference VSEN, so the phase difference determining signal PDS is determined to be at high level from the detection timing point TMa, and is reset when the enable signal EN is at high level again. And at the detection timing point TMb, the reference voltage VREF is lower than the voltage difference VSEN, so the phase difference determining signal PDS is determined to be at low level from the detection timing point TMb, and is reset when the enable signal EN is at high level again.

Referring to FIG. 9, in this embodiment, TC is a time length control signal lasting for a period that includes the falling edge of the enable signal EN. The signal conversion circuit 22 generates an impedance control signal ZCO with a pre-determined time length according to the time length control signal TC and the phase difference determining signal PDS when the phase difference determining signal PDS is at high level, to control the impedance of the aforementioned impedance matching circuit 32 such that the load current phase difference PDLD is regulated at a pre-determined phase difference. The pre-determined time length corresponds to the time length of the time length control signal TC.

In one embodiment, the signal conversion circuit 22 may include a digital to analog signal conversion circuit (DAC) which can convert the phase difference determining signal PDS into the impedance control signal ZCO with analog form.

Note that, in the embodiments in FIGS. 8 and 9, the impedance control signal ZCO not only can be used to control the impedance of the impedance matching circuit 32 for regulating the load current phase difference PDLD at a pre-determined phase difference as in the embodiment shown in FIG. 7, but also can be used in away similar to the frequency control signal FCO as in the embodiment shown in FIG. 11, wherein the frequency control signal FCO controls the operating frequency FP such that the load current phase difference PDLD is regulated at a pre-determined phase difference.

In the aforementioned resonant wireless power transmitter circuits (for example but not limited to the resonant wireless power transmitter circuit 2, 3, 4 and 5 in FIGS. 3A, 3B, 5 and 7), the power conversion circuits 10 are illustrated by half-bridge power conversion circuits, which should be understood as illustrative examples instead of limiting. The resonant wireless power transmitter circuit may include a full-bridge power conversion circuit instead of the half-bridge power conversion circuit and still can achieve all the aforementioned operations and functions.

Figure 10:
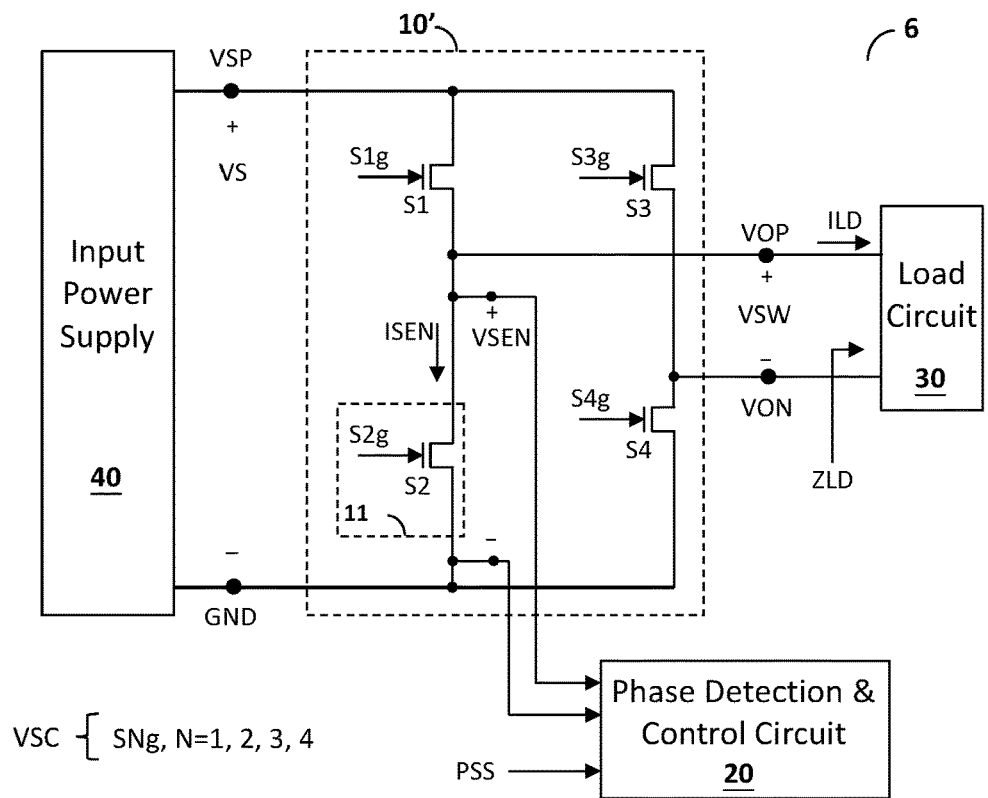
FIG. 10 shows a schematic diagram of a specific embodiment of the phase detection and control circuit of the resonant wireless power transmitter circuit according to the present invention.

FIG. 10 shows a schematic diagram of an embodiment of the resonant wireless power transmitter circuit (resonant wireless power transmitter circuit 7) according to the present invention. This embodiment is similar to the resonant wireless power transmitter circuit 2 shown in FIG. 3A, but is different in that the power conversion circuit 10' is a full-bridge power conversion circuit. In this embodiment, the plural power switches include power switches S1, S2, S3 and S4, wherein each of the power switches S1, S2, S3 and S4 has a current inflow terminal and a current outflow terminal:

The current outflow terminal of S1 and the current inflow terminal of S2 are connected to a positive output node VOP.

The current outflow terminal of S3 and the current inflow terminal of S4 are connected to a negative output node VON.

The current inflow terminal of S1 and the current inflow terminal of S3 are connected to a positive input node VSP which is coupled to the power supply 40.

The current outflow terminal of S2 and the current outflow terminal of S4 are connected to a ground node.

In this embodiment, the switching phases of the power switches S1 and S2 are opposite to each other, and the switching phases of the power switches S3 and S4 are opposite to each other. In one embodiment, the duty ratio of each of the power switches S1, S2, S3 and S4 is substantially close to and lower than 50 time %. Note that the duty ratio being substantially close to and lower than 50 time % indicates that the duty ratio of the power switch S1 is substantially equal to S2, and the duty ratio of the power switch S3 is substantially equal to S4, and each duty ratio is close to 50 time %. As explained hereinbefore, for avoiding shoot-through, there is a dead time period to ensure not both of the power switches S1 and S2 are ON at the same time and not both of the power switches S3 and S4 are ON at the same time. All the power switches S1 S2, S3 and S4 are OFF in the dead time period. For this reason, the duty ratios of the power switches S1 S2, S3 and S4 are substantially close to, but not exactly equal to 50 time %. The dead time period is for example but not limited to shorter than 5 time % of a complete cycle period.

In the power conversion circuit 10', one of the plural power switches (for example but not limited to the power switch S2 shown in the figure; in one embodiment, S2 may be a MOSFET switch) is used as the current sensing device 11, that is, the current inflow terminal, the current outflow terminal and the control terminal of the current sensing device 11 are the current inflow terminal, the current outflow terminal and the control terminal of this power switch (i.e. S2) respectively. A sensing current ISEN flows through the current sensing device 11 and a voltage difference VSEN is generated, wherein the sensing current ISEN corresponds to a conduction current of the corresponding power switch (such as the drain-source current of S2) and the voltage difference VSEN corresponds to a voltage difference between the current inflow terminal and the current outflow terminal of the corresponding power switch (such as the drain-source voltage difference of S2).

Referring to FIG. 10, a phase detection and control circuit 20 is coupled between the current inflow terminal and the current outflow terminal of the current sensing device 11. The phase detection and control circuit 20 determines a detection timing point TM within a dead time period (for example but not limited to the aforementioned dead time period TDD), and detects the level of the voltage difference VSEN at the detection timing point TM to determine the load current phase difference PDLD.

Besides the illustrative embodiment shown in FIG. 10, in all other aforementioned embodiments of the resonant wireless power transmitter circuit according to the present invention, the half-bridge power conversion circuit therein can be replaced by a full-bridge power conversion circuit with similar connection relationships as illustrated in FIG. 10 to provide similar functions, which are not repeated here.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. As an example, the "varactor" and the "switch-control capacitor circuit" can be used together, such that the resonant wireless power transmitter circuit can have advantages from both kinds of impedance matching circuits. Furthermore, those skilled in this art can readily conceive variations and modifications within the spirit of the present invention. For example, in the aforementioned embodiments, the current sensing device is realized by the low side power switch (S2) of the half-bridge or full-bridge power conversion circuit. However, the current sensing device may be implemented by any other switch of the plural power switches, for example S1 of the aforementioned half-bridge power conversion circuit, or S1, or S3 or S4 of the aforementioned full-bridge power conversion circuit. To use a different power switch as the current sensing device, corresponding modifications such as the signal polarities, etc. should be made. Or, more than one power switch may be used to detect the load current phase difference. As another example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A resonant wireless power transmitter circuit, comprising:
  a load circuit;
  a power conversion circuit which is coupled between an input power supply and the load circuit, wherein the power conversion circuit is a half-bridge or a full bridge power conversion circuit, and includes a plurality of power switches and a current sensing device, wherein the plurality of power switches are configured to operably switch with an operating frequency to convert the input power supply to an output power for driving the load circuit such that the load circuit has a load current, wherein there is a load current phase difference between the load current and load voltage at the operating frequency; and
  a phase detection and control circuit, configured to operably detect a voltage difference between a current inflow terminal and a current outflow terminal of the current sensing device within a dead time period in which each of the plurality of power switches are OFF, wherein the voltage difference corresponds to the load current phase difference.

2. The resonant wireless power transmitter circuit of claim 1, wherein the input power supply is connected between a positive input node and a ground node, and the output power is coupled between a positive output node and a negative output node;
  wherein (A) when the power conversion circuit is a half-bridge power conversion circuit, the plurality of power switches include a first power switch and a second power switch, wherein each of the first power switch and second power switch has a current inflow terminal and a current outflow terminal, the current outflow terminal of the first power switch and the current inflow terminal of the second power switch being connected to the positive output node, the current outflow terminal of the second power switch being connected to the negative output node, the current inflow terminal of the first power switch being connected to the positive input node, and the negative output node being connected to the ground node; or
  (B) when the power conversion circuit is a full-bridge power conversion circuit, the plurality of power switches include a first power switch, a second power switch, a third power switch and a fourth power switch, wherein each of the first power switch, the second power switch, the third power switch and the fourth power switch has a current inflow terminal and a current outflow terminal, the current outflow terminal of the first power switch and the current inflow terminal of the second power switch being connected to the positive output node, the current outflow terminal of the third power switch and the current inflow terminal of the fourth power switch being connected to the negative output node, the current inflow terminal of the first power switch and the current inflow terminal of the third power switch being connected to the positive input node, and the current outflow terminal of the second power switch and the current outflow terminal of the fourth power switch being connected to the ground node;

wherein the current sensing device is one of the plurality of power switches, and the voltage difference between the current inflow terminal and the current outflow terminal of the current sensing device is a voltage difference between the current inflow terminal and the current outflow terminal of this power switch.

3. The resonant wireless power transmitter circuit of claim 2, wherein the phase detection and control circuit detects the voltage difference within a time period which starts from a time point when the current sensing device is turned from ON to OFF and ends at a time point when one of the plurality of power switches are turned from OFF to ON.

4. The resonant wireless power transmitter circuit of claim 1, wherein the load circuit is a resonant circuit which includes:
a transmitter circuit, including at least a transmitter coil; and
an impedance matching circuit which is coupled to the transmitter circuit;
wherein the transmitter circuit and the impedance matching circuit convert the load current into a wireless output power through resonant effect, wherein the transmitter coil transmits the wireless output power to a wireless field for wireless power transmission;
wherein the impedance matching circuit includes: one or more capacitors, and/or one or more varactors, and/or one or more switch-control capacitor circuits; wherein each of the one or more switch-control capacitor circuits includes at least one capacitor and at least one capacitor control switch connected to each other, wherein a reactance of the switch-control capacitor circuit is controlled by turning ON or OFF the at least one capacitor control switch.

5. The resonant wireless power transmitter circuit of claim 4, wherein the phase detection and control circuit further generates an impedance control signal according to the voltage difference to control the impedance matching circuit for adjusting the impedance of the impedance matching circuit such that the load current phase difference is regulated at a pre-determined phase difference level.

6. The resonant wireless power transmitter circuit of claim 5, wherein the resonant circuit includes a resonant input impedance, and the phase detection and control circuit regulates the load current phase difference such that the resonant input impedance is matched.

7. The resonant wireless power transmitter circuit of claim 5, wherein the phase detection and control circuit includes:
a phase difference determining circuit which includes a comparison circuit and a detection timing circuit, wherein the comparison circuit compares the voltage difference and a reference voltage to generate a comparison result, and the detection timing circuit selectively latches the comparison result to generate a phase difference determining signal according to a pre-determined detection timing point, wherein the pre-determined detection timing point is a pre-determined time point within the dead time period; and
a signal conversion circuit, including a logic circuit which generates the impedance control signal according to the phase difference determining signal and a time length signal.

8. The resonant wireless power transmitter circuit of claim 7, wherein the phase detection and control circuit generates the reference voltage according to a phase setting signal to regulate the load current phase difference at the pre-determined phase difference level.

9. The resonant wireless power transmitter circuit of claim 4, wherein the phase detection and control circuit further generates a frequency control signal according to the voltage difference to control the operating frequency such that the load current phase difference is regulated at a pre-determined phase difference level.

10. The resonant wireless power transmitter circuit of claim 2, wherein the duty ratio of each of the plurality of power switches are greater than 47.5% and less than 50%.

11. A phase detection and control circuit, configured to operably control a resonant wireless power transmitter circuit which comprises: a load circuit; and a power conversion circuit which is coupled between an input power supply and the load circuit, wherein the power conversion circuit is a half-bridge or a full bridge power conversion circuit, and includes a plurality of power switches and a current sensing device, wherein the plurality of power switches are configured to operably switch with an operating frequency to convert the input power supply to an output power for driving the load circuit such that the load circuit has a load current, wherein there is a load current phase difference between the load current and load voltage at the operating frequency; wherein a phase detection and control circuit detects a voltage difference between the current inflow terminal and the current outflow terminal of the current sensing device within a dead time period in which each of the plurality of power switches are OFF, wherein the voltage difference corresponds to the load current phase difference; the phase detection and control circuit including:
a phase difference determining circuit which includes a comparison circuit and a detection timing circuit, wherein the comparison circuit compares the voltage difference and a reference voltage to generate a comparison result, and the detection timing circuit selectively latches the comparison result to generate a phase difference determining signal according to a pre-determined detection timing point, wherein the pre-determined detection timing point is a pre-determined time point within the dead time period; and
a signal conversion circuit, including a logic circuit which generates an impedance control signal according to the phase difference determining signal and a time length signal.

12. The phase detection and control circuit of claim 11, wherein the input power supply is connected between a positive input node and a ground node, and the output power is coupled between a positive output node and a negative output node;
wherein (A) when the power conversion circuit is a half-bridge power conversion circuit, the plurality of power switches include a first power switch and a second power switch, wherein each of the first power switch and second power switch has a current inflow terminal and a current outflow terminal, the current outflow terminal of the first power switch and the current inflow terminal of the second power switch being connected to the positive output node, the current outflow terminal of the second power switch being connected to the negative output node, the current inflow terminal of the first power switch being connected to the positive input node, and the negative output node being connected to the ground node; or (B) when the power conversion circuit is a full-bridge power conversion circuit, the plurality of power switches include a first power switch, a second power switch, a third power switch and a fourth power switch, wherein each of the first power switch, the second power switch, the third power switch and the fourth power switch has a current inflow terminal and a current outflow terminal, the current outflow terminal of the first power switch and the current inflow terminal of the second power switch being connected to the positive output node, the current outflow terminal of the third power switch and the current inflow terminal of the fourth power switch being connected to the negative output node, the current inflow terminal of the first power switch and the current inflow terminal of the third power switch being connected to the positive input node, and the current outflow terminal of the second power switch and the current outflow terminal of the fourth power switch being connected to the ground node;

wherein the current sensing device is one of the plurality of power switches, and the voltage difference between the current inflow terminal and the current outflow terminal of the current sensing device is a voltage difference between the current inflow terminal and the current outflow terminal of this power switch.

13. The phase detection and control circuit of claim 12, wherein the phase detection and control circuit detecting the voltage difference within a time period which starts from a time point when the current sensing device is turned from ON to OFF and ends at a time point when one of the plurality of power switches are turned from OFF to ON.

14. The phase detection and control circuit of claim 11, wherein the load circuit is a resonant circuit which includes:
   a transmitter circuit, including at least a transmitter coil; and
   an impedance matching circuit which is coupled to the transmitter circuit;
   wherein the transmitter circuit and the impedance matching circuit convert the load current into a wireless output power through resonant effect, wherein the transmitter coil transmits the wireless output power to a wireless field for wireless power transmission;
   wherein the impedance matching circuit includes: one or more capacitors, and/or one or more varactors, and/or one or more switch-control capacitor circuits; wherein each of the one or more switch-control capacitor circuits includes at least one capacitor and at least one capacitor control switch connected to each other, wherein a reactance of the switch-control capacitor circuit is controlled by turning ON or OFF the at least one capacitor control switch.

15. The phase detection and control circuit of claim 14, wherein the phase detection and control circuit generates the impedance control signal according to the voltage difference to control the impedance matching circuit for adjusting the impedance of the impedance matching circuit such that the load current phase difference is regulated at a pre-determined phase difference level.

16. The phase detection and control circuit of claim 15, wherein the resonant circuit includes a resonant input impedance, and the phase detection and control circuit regulates the load current phase difference such that the resonant input impedance is matched.

17. The phase detection and control circuit of claim 15, wherein the phase detection and control circuit generates the reference voltage according to a phase setting signal to regulate the load current phase difference at the pre-determined phase difference level.

18. The phase detection and control circuit of claim 13, wherein the phase detection and control circuit further generates a frequency control signal according to the voltage difference to control the operating frequency such that the load current phase difference is regulated at a pre-determined phase difference level.

19. The phase detection and control circuit of claim 12, wherein the duty ratio of each of the plurality of power switches are greater than 47.5% and less than 50%.

20. A driving circuit, configured to operably drive a resonant wireless power transmitter circuit which comprises a load circuit; the driving circuit including:
   a power conversion circuit which is coupled between an input power supply and the load circuit, wherein the power conversion circuit is a half-bridge or a full bridge power conversion circuit, and includes a plurality of power switches and a current sensing device, wherein the plurality of power switches are configured to operably switch with an operating frequency to convert the input power supply to an output power for driving the load circuit such that the load circuit has a load current, wherein there is a load current phase difference between the load current and load voltage at the operating frequency; and
   a phase detection and control circuit, configured to operably detect a voltage difference between the current inflow terminal and the current outflow terminal of the current sensing device within a dead time period in which each of the plurality of power switches are OFF, wherein the voltage difference corresponds to the load current phase difference.

21. The driving circuit of claim 20, wherein the input power supply is connected between a positive input node and a ground node, and the output power is coupled between a positive output node and a negative output node;
   wherein (A) when the power conversion circuit is a half-bridge power conversion circuit, the plurality of power switches include a first power switch and a second power switch, wherein each of the first power switch and second power switch has a current inflow terminal and a current outflow terminal, the current outflow terminal of the first power switch and the current inflow terminal of the second power switch being connected to the positive output node, the current outflow terminal of the second power switch being connected to the negative output node, the current inflow terminal of the first power switch being connected to the positive input node, and the negative output node being connected to the ground node; or
   (B) when the power conversion circuit is a full-bridge power conversion circuit, the plurality of power switches include a first power switch, a second power switch, a third power switch and a fourth power switch, wherein each of the first power switch, the second power switch, the third power switch and the fourth power switch has a current inflow terminal and a current outflow terminal, the current outflow terminal of the first power switch and the current inflow terminal of the second power switch being connected to the positive output node, the current outflow terminal of the third power switch and the current inflow terminal of the fourth power switch being connected to the negative output node, the current inflow terminal of the first power switch and the current inflow terminal of the third power switch being connected to the positive input node, and the current outflow terminal of the second power switch and the current outflow terminal of the fourth power switch being connected to the ground node;

wherein the current sensing device is one of the plurality of power switches, and the voltage difference between the current inflow terminal and the current outflow terminal of the current sensing device is a voltage difference between the current inflow terminal and the current outflow terminal of this power switch.

22. The driving circuit of claim 21, wherein the phase detection and control circuit detects the voltage difference within a time period which starts from a time point when the current sensing device is turned from ON to OFF and ends at a time point when one of the plurality of power switches are turned from OFF to ON.

23. The driving circuit of claim 20, wherein the load circuit is a resonant circuit which includes:
a transmitter circuit, including at least a transmitter coil; and
an impedance matching circuit which is coupled to the transmitter circuit;
wherein the transmitter circuit and the impedance matching circuit convert the load current into a wireless output power through resonant effect, wherein the transmitter coil transmits the wireless output power to a wireless field for wireless power transmission;
wherein the impedance matching circuit includes: one or more capacitors, and/or one or more varactors, and/or one or more switch-control capacitor circuits; wherein each of the one or more switch-control capacitor circuits includes at least one capacitor and at least one capacitor control switch connected to each other, wherein a reactance of the switch-control capacitor circuit is controlled by turning ON or OFF the at least one capacitor control switch.

24. The driving circuit of claim 23, wherein the phase detection and control circuit further generates an impedance control signal according to the voltage difference to control the impedance matching circuit for adjusting the impedance of the impedance matching circuit such that the load current phase difference is regulated at a pre-determined phase difference level.

25. The driving circuit of claim 24, wherein the resonant circuit includes a resonant input impedance, and the phase detection and control circuit regulates the load current phase difference such that the resonant input impedance is matched.

26. The driving circuit of claim 24, wherein the phase detection and control circuit includes:
a phase difference determining circuit which includes a comparison circuit and a detection timing circuit, wherein the comparison circuit compares the voltage difference and a reference voltage to generate a comparison result, and the detection timing circuit selectively latches the comparison result to generate a phase difference determining signal according to a pre-determined detection timing point, wherein the pre-determined detection timing point is a pre-determined time point within the dead time period; and
a signal conversion circuit, including a logic circuit which generates the impedance control signal according to the phase difference determining signal and a time length signal.

27. The driving circuit of claim 26, wherein the phase detection and control circuit generates the reference voltage according to a phase setting signal to regulate the load current phase difference at the pre-determined phase difference level.

28. The driving circuit of claim 21, wherein the phase detection and control circuit further generates a frequency control signal according to the voltage difference to control the operating frequency such that the load current phase difference is regulated at a pre-determined phase difference level.

29. The driving circuit of claim 21, wherein the duty ratio of each of the plurality of power switches are greater than 47.5% and less than 50%.

30. A method for controlling a resonant wireless power transmitter circuit which comprises: a load circuit; and a power conversion circuit which is coupled between an input power supply and the load circuit, wherein the power conversion circuit is a half-bridge or a full bridge power conversion circuit, and includes a plurality of power switches and a current sensing device, wherein the plurality of power switches are configured to operably switch with an operating frequency to convert the input power supply to an output power for driving the load circuit such that the load circuit has a load current, wherein there is a load current phase difference between the load current and load voltage at the operating frequency; the control method including:
determining a dead time period in which each of the plurality of power switches are OFF; and
detecting a voltage difference between the current inflow terminal and the current outflow terminal of the current sensing device within the dead time period, wherein the voltage difference corresponds to the load current phase difference.

31. The method of claim 30, wherein the input power supply is connected between a positive input node and a ground node, and the output power is coupled between a positive output node and a negative output node;
wherein (A) when the power conversion circuit is a half-bridge power conversion circuit, the plurality of power switches include a first power switch and a second power switch, wherein each of the first power switch and second power switch has a current inflow terminal and a current outflow terminal, the current outflow terminal of the first power switch and the current inflow terminal of the second power switch being connected to the positive output node, the current outflow terminal of the second power switch being connected to the negative output node, the current inflow terminal of the first power switch being connected to the positive input node, and the negative output node being connected to the ground node; or
(B) when the power conversion circuit is a full-bridge power conversion circuit, the plurality of power switches include a first power switch, a second power switch, a third power switch and a fourth power switch, wherein each of the first power switch, the second power switch, the third power switch and the fourth power switch has a current inflow terminal and a current outflow terminal, the current outflow terminal of the first power switch and the current inflow terminal of the second power switch being connected to the positive output node, the current outflow terminal of the third power switch and the current inflow terminal of the fourth power switch being connected to the negative output node, the current inflow terminal of the first power switch and the current inflow terminal of the third power switch being connected to the positive input node, and the current outflow terminal of the second power switch and the current outflow terminal of the fourth power switch being connected to the ground node;

wherein the current sensing device is one of the plurality of power switches, and the voltage difference between the current inflow terminal and the current outflow terminal of the current sensing device is a voltage difference between the current inflow terminal and the current outflow terminal of this power switch.

32. The method of claim 31, wherein the dead time is a time period which starts from a time point when the current sensing device is turned from ON to OFF and ends at a time point when one of the plurality of power switches are turned from OFF to ON.

33. The method of claim 30, wherein the load circuit is a resonant circuit which includes a transmitter circuit and an impedance matching circuit, wherein the transmitter circuit includes at least a transmitter coil; the transmitter coil and the impedance matching circuit converting the load current into a wireless output power through resonant effect, wherein the transmitter coil transmits the wireless output power to a wireless field for wireless power transmission; and Wherein the impedance matching circuit includes: one or more capacitors, and/or one or more varactors, and/or one or more switch-control capacitor circuits; wherein each of the one or more switch-control capacitor circuits includes at least one capacitor and at least one capacitor control switch connected to each other, wherein a reactance of the switch-control capacitor circuit is controlled by turning ON or OFF the at least one capacitor control switch.

34. The method of claim 33, further including: generating an impedance control signal according to the voltage difference to control the impedance matching circuit for adjusting the impedance of the impedance matching circuit such that the load current phase difference is regulated at a pre-determined phase difference level.

35. The method of claim 34, wherein the resonant circuit includes a resonant input impedance, and the method further includes: regulating the load current phase difference such that the resonant input impedance is matched.

36. The method of claim 34, wherein the step of generating the impedance control signal includes:
comparing the voltage difference and a reference voltage to generate a comparison result;
selectively latching the comparison result to generate a phase difference determining signal according to a pre-determined detection timing point, wherein the pre-determined detection timing point is a pre-determined time point within the dead time period; and
generating the impedance control signal according to the phase difference determining signal and a time length signal.

37. The method of claim 36, wherein the step of generating the impedance control signal further includes: generating the reference voltage according to a phase setting signal to regulate the load current phase difference at the pre-determined phase difference level.

38. The method of claim 30, further including: generating a frequency control signal according to the voltage difference to control the operating frequency such that the load current phase difference is regulated at a pre-determined phase difference level.

39. The method of claim 31, wherein the duty ratio of each of the plurality of power switches are greater than 47.5% and less than 50%.

* * * * *